United States Patent
Hwang et al.

(10) Patent No.: US 9,374,885 B2
(45) Date of Patent: Jun. 21, 2016

(54) CERAMIC ELEMENTS MODULE

(71) Applicant: SAMSUNG ELECTRO-MECHANICS CO., LTD., Suwon Gyunggi-do (KR)

(72) Inventors: Gyu Man Hwang, Yongin-si (KR); Dae Hyeong Lee, Seoul (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 826 days.

(21) Appl. No.: 13/658,332

(22) Filed: Oct. 23, 2012

(65) Prior Publication Data
US 2013/0043064 A1   Feb. 21, 2013

Related U.S. Application Data

(63) Continuation of application No. 12/461,922, filed on Aug. 27, 2009, now Pat. No. 8,307,546.

(30) Foreign Application Priority Data

Jul. 2, 2009   (KR) .................. 10-2009-0060242

(51) Int. Cl.
*H05K 1/00* (2006.01)
*H05K 1/16* (2006.01)
*H05K 1/02* (2006.01)
(Continued)

(52) U.S. Cl.
CPC .............. *H05K 1/0203* (2013.01); *H05K 7/205* (2013.01); *H05K 1/0306* (2013.01); *H05K 3/0061* (2013.01); *H05K 3/4629* (2013.01); *H05K 2201/0969* (2013.01);
(Continued)

(58) Field of Classification Search
CPC .............. H05K 1/0203; H05K 1/0306; H05K 2201/10598; H05K 3/0061; H05K 7/205
USPC .................................... 174/252, 260
See application file for complete search history.

(56) References Cited

U.S. PATENT DOCUMENTS 4,450,471 A * 5/1984 Wellhoefer et al. ............ 257/717
7,220,365 B2 * 5/2007 Qu et al. ......................... 252/70
(Continued)

FOREIGN PATENT DOCUMENTS

JP   07-058426   3/1995
JP   07-273462   10/1995
(Continued)

OTHER PUBLICATIONS

Japanese Office Action dated Sep. 5, 2011 issued in corresponding Japanese Patent Application No. 2009-200515.
(Continued)

*Primary Examiner* — Timothy Thompson
*Assistant Examiner* — Rhadames J Alonzo Miller
(74) *Attorney, Agent, or Firm* — McDermott Will & Emery LLP

(57) ABSTRACT

A ceramic elements module including ceramic elements that have a plurality of lower inserting grooves; an electronic component that is mounted on a lower surface of the ceramic elements; and a heat sink that is coupled with a lower part of the ceramic elements mounted with the electronic component and has a first penetrating hole corresponding to the lower inserting groove and a second penetrating hole into which the electronic component is inserted.

6 Claims, 5 Drawing Sheets

(51) Int. Cl.
　　*H05K 7/20*　　(2006.01)
　　*H05K 1/03*　　(2006.01)
　　*H05K 3/00*　　(2006.01)
　　*H05K 3/46*　　(2006.01)

(52) U.S. Cl.
　　CPC ............... *H05K 2201/10598* (2013.01); *H05K 2203/063* (2013.01); *Y10T 29/4913* (2015.01); *Y10T 29/49126* (2015.01)

(56) References Cited

U.S. PATENT DOCUMENTS

| | | | |
|---|---|---|---|
| 7,365,273 B2* | 4/2008 | Fairchild et al. | 174/260 |
| 2005/0121774 A1* | 6/2005 | Waldvogel et al. | 257/706 |
| 2006/0120058 A1* | 6/2006 | Fairchild | H01L 23/13 361/761 |
| 2009/0178828 A1* | 7/2009 | Tsumura et al. | 174/252 |

FOREIGN PATENT DOCUMENTS

| | | |
|---|---|---|
| JP | 08-125287 | 5/1996 |
| JP | 10-70210 | 3/1998 |
| JP | 2001-068821 | 3/2001 |
| JP | 2008-262948 | 10/2008 |
| JP | 2008262948 A * | 10/2008 |
| JP | 2009-123736 | 6/2009 |
| KR | 10-0658536 | 12/2006 |
| KR | 10-2007-0099132 | 10/2007 |
| KR | 10-0825766 | 4/2008 |

OTHER PUBLICATIONS

Notice of Allowance issued by the Korean Office Action in the corresponding Korean patent application.

U.S. Office Action dated Jan. 12, 2012 issued in copending U.S. Appl. No. 12/461,922.

U.S. Notice of Allowance dated Sep. 5, 2012 issued in copending U.S. Appl. No. 12/461,922.

U.S. Appl. No. 12/461,922, filed Aug. 27, 2009, Gyu Man Hwang, Samsung Electro-Mechanics Co., Ltd.

* cited by examiner

CERAMIC ELEMENTS MODULE

CROSS-REFERENCE TO RELATED APPLICATIONS

The present application is a divisional of U.S. application Ser. No. 12/461,922, filed on Aug. 27, 2009, which claims priority under 35 U.S.C. 119 and 35 U.S.C. 365 to Korean Patent Application No. 10-2009-0060242, filed on Jul. 2, 2009 in the Korean Intellectual Property Office, the disclosures of which are hereby incorporated by reference in their entirety.

BACKGROUND

1. Field

The present invention relates to a ceramic elements module and a manufacturing method thereof, and more particularly, to a ceramic elements module that includes ceramic elements that have lower inserting grooves, a heat sink that has a first penetrating hole, and a fixing member that is engaged with the lower inserting grooves through the first penetrating hole to fix the ceramic elements to the heat sink, and a manufacturing method thereof.

2. Description of the Related Art

With the recent development of technique in electronic apparatuses, the apparatuses themselves become slimness and lightweight so that the integration of components is indispensable.

For the integration of components, a multi-layer ceramic substrate that is formed by stacking a plurality of ceramic green sheets has been developed. Such a multi-layer ceramic substrate has heat resistance, abrasion resistance, and excellent electrical property, such that it has been commonly used as a substitute for a printed circuit board in the related art and the demand thereof has been gradually increased.

As such a multi-layer ceramic substrate, a high temperature co-fired ceramic (HTCC) substrate or a low temperature co-fired ceramic (LTCC) substrate is widely used, wherein the HTCC substrate, which is an abbreviation of a high temperature co-fired ceramic, is annealed at a temperature of 1500° C. or more to form a multi-layer substrate.

Such a HTCC substrate is advantageous in view of mechanical strength and chemical-resistant property, but is disadvantageous in view of high-frequency property and has a higher thermal expansion coefficient than a silicon semiconductor device by about two times, thereby being a significant problem in an application field where a matching of thermal expansion coefficients is required.

To the contrary, the LTCC substrate, which is an abbreviation of a low temperature co-fired ceramic, is annealed at a temperature of 900° C. or less to form a multi-layer substrate. The ceramic elements substrate can be co-fired at a low temperature as the firing temperature becomes 900° C. or less and has an excellent electrical property, such that it has been widely used in a passive device for high frequency communication and a control component for electrical device.

The ceramic elements module used in the control component for electrical device as described above will be described in brief. The ceramic elements module includes ceramic elements configured of a plurality of ceramic green sheets, an angle sensor that is mounted on a lower surface of the ceramic elements, and a heat sink that is positioned on a lower part of the ceramic elements mounted with the angle sensor and has a groove with a predetermined position into which the angle sensor is inserted. At this time, the angle sensor is a sensor that senses and outputs an angle that a handle is rotated by a driver's operation.

The ceramic elements mounted with the angle sensor is coupled to the heat sink by epoxy coated on a junction interface between the ceramic elements and the heat sink.

However, there commonly occurs a case where the ceramic elements move moves during a curing process due to its long curing time. Therefore, absolute position value of the ceramic elements is changed, causing errors in concentricity of the angle sensor. Further, the curing process is performed in a high-temperature atmosphere, causing a deformation in the ceramic elements, such as a distortion, etc.

SUMMARY

The present invention proposes to solve the disadvantages and problems presented in a ceramic elements module and a manufacturing method thereof. It is an object of the present invention to provide a ceramic elements module that includes ceramic elements that have lower inserting grooves, a heat sink that has a first penetrating hole, and a fixing member that is engaged with the lower inserting grooves through the first penetrating hole to fix the ceramic elements to the heat sink, to improve the coupled precision between the ceramic elements and the heat sink, and a manufacturing method thereof.

In order to accomplish the object, according to an embodiment of the present invention, there is provided a ceramic elements module including: ceramic elements that have a plurality of lower inserting grooves; an electronic component that is mounted on a lower surface of the ceramic elements; and a heat sink that is coupled with a lower part of the ceramic elements mounted with the electronic component and has a first penetrating hole corresponding to the lower inserting groove and a second penetrating hole into which the electronic component is inserted.

Further, the electronic component may be an angle sensor.

Moreover, the inserting groove and the first penetrating hole may be formed in a circular shape or in a rectangular shape.

Also, the ceramic elements module may further include a fixing member that is engaged with the lower inserting groove through the first penetrating hole to fix the ceramic elements to the heat sink.

In addition, an adhering member may be provided on a junction surface between the ceramic elements and the heat sink.

In order to accomplish the object, according to an embodiment of the present invention, there is provided a manufacturing method of a ceramic elements module including: providing ceramic elements that have a plurality of lower inserting grooves; mounting an electronic component on a lower surface of the ceramic elements; providing a heat sink that has a first penetrating hole corresponding to the lower inserting groove and a second penetrating hole into which the electronic component is inserted to a lower part of the ceramic elements; coupling the ceramic elements with the heat sink; engaging a fixing member with the lower inserting groove of the ceramic elements by passing through the first penetrating hole of the heat sink; and removing the fixing member.

Further, the providing the ceramic elements that includes a plurality of lower inserting grooves may include: having an upper green sheet part; having a lower green sheet part provided with a plurality of cavities under the upper green sheet part; and stacking and firing the upper and lower green sheet parts.

Moreover, in the having the lower green sheet provided with the plurality of cavities, the cavities may be formed using a punching method.

Also, in the stacking and firing the upper and lower green sheet parts, the ceramic elements may be provided with the lower inserting grooves by the cavities of the lower green sheet part.

In addition, in the mounting the electronic component on the lower surface of the ceramic elements, the electronic component, which is an angle sensor, may be mounted on the ceramic elements through a surface mounting technology (SMT).

Further, the manufacturing method of the ceramic elements module may further include, before the coupling the ceramic elements with the heat sink: coating an adhering member on a junction interface between the ceramic elements and the heat sink.

Moreover, before the removing the fixing member, the manufacturing method of the ceramic elements module may further include: curing the adhering member coated on the junction interface between the ceramic elements and the heat sink.

BRIEF DESCRIPTION OF THE DRAWINGS

These and/or other aspects and advantages of the invention will become apparent and more readily appreciated from the following description of the embodiments, taken in conjunction with the accompanying drawings of which.

<DESCRIPTION FOR KEY ELEMENTS IN THE DRAWINGS>

| | |
|---|---|
| 100: Ceramic elements module | 110: Ceramic elements |
| 113a: Lower inserting groove | 120: Electronic component |
| 130: Heat sink | 131: Penetrating hole |

DESCRIPTION OF EMBODIMENTS

The acting effects as well as the technical constitution of a ceramic elements module and a manufacturing method thereof according to the present invention will be clearly understood by the detailed description below with reference to the accompanying drawings where the exemplary embodiments of the present invention are illustrated.

Hereinafter, a ceramic elements module and a manufacturing method thereof according to the present invention will be described in detail with reference to FIGS. 1 to 9.

A Ceramic Elements Module

A ceramic elements module according to an embodiment of the present invention will be described in detail with reference to FIG. 1.

Figure 1:
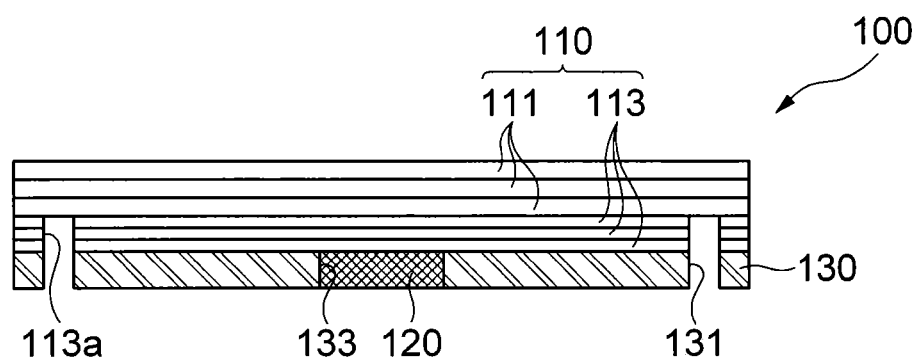
FIG. 1 is a cross-sectional view of a ceramic elements module according to an embodiment of the present invention.

FIG. 1 is a cross-sectional view of a ceramic elements module according to an embodiment of the present invention.

Referring to FIG. 1, the ceramic elements module 100 according to an embodiment of the present invention may include ceramic elements 110, an electronic component 120 mounted on the ceramic elements 110, and a heat sink 130. And, the ceramic elements module 100 may further include a fixing member 150 that fixes the ceramic elements 110 to the heat sink 130.

Herein, the ceramic elements module 100 is a module used in a control component for electrical device.

More specifically, the ceramic elements module 100 is used in an electric power steering (EPS) of the control component for electrical device. At this time, the EPS is a power steering apparatus that has a basic function to convert each potential of a steering handle to steering angles of a tire, but provides comfortable steering feel at a low speed simultaneously with stable steering feel at a high speed according to the change in vehicle speed.

The ceramic elements 110, which are a low temperature co-fired (LTCC) ceramic, may include a plurality of lower inserting grooves 113a. At this time, the lower inserting grooves 113a may be formed in a circular shape or a rectangular shape. A manufacturing method of the ceramic elements 110 including the lower inserting grooves 113a will be described later in detail.

The electronic component 120 is mounted on a lower surface of the ceramic elements 110. The electronic component 120 may be soldered on the ceramic elements 110 by a surface mounting technology (SMT). At this time, the electronic component 120 is an angle sensor that senses and outputs an angle that a handle is rotated by a driver's operation.

As described above, the ceramic elements 110 mounted with the electronic component 120 is heated by the electronic component 120, wherein the heat is not properly discharged to the outside but is accumulated in the ceramic elements 110, thereby deteriorating the characteristics of the electronic component 120.

Therefore, a heat sink 130 may be provided on a lower part of the ceramic elements 110. The heat sink 130 serves to discharge heat, etc. transferred from the ceramic elements 110 and the electronic component 120 to the outside. Therefore, the heat sink 130 preferably includes material having a large heat transfer coefficient so that it can effectively remove heat. For example, the heat sink 130 may include aluminum, copper, silver, gold, etc.

The heat sink 130 may include a first penetrating hole 131 on a position corresponding to the lower inserting groove 113a and a second penetrating hole 133 on a position into which the electronic component 120 is inserted. At this time, the first penetrating hole 131 may be formed in the same shape as the lower inserting groove 113a.

In other words, the ceramic elements 110 are seated on an upper part of the heat sink 130 and the electronic component 120 is inserted into the second penetrating hole 133, thereby being coupled to each other. At this time, an adhering member 140 may be provided on a junction interface between the ceramic elements 110 and the heat sink 130. The adhering member 140 may be formed of epoxy or grease.

The fixing member 150 is engaged with the lower inserting groove 113a through the first penetrating hole 131, thereby making it possible to fix the ceramic elements 110 to the heat sink 130. The fixing member 150 may be formed in a guide pin shape, but it is not always limited thereto.

As described above, if the ceramic elements 110 and the heat sink 130 are fixed by the fixing member 150, the adhering member 140 coated on the junction interface between the ceramic elements 110 and the heat sink 130 is cured in a high temperature atmosphere and then the fixing member 150 is removed. At this time, the fixing member 150 may be formed of material not easily deformed by heat.

As described above, the fixing member 150 that fixes the ceramic elements 110 to the heat sink 130 is provided, such that coupled precision between the ceramic elements 110 and the heat sink 130 is improved and errors in concentricity of the electronic component 120 are minimized, making it possible to enhance reliability and marketability of the product. Further, even after being cured, the ceramic elements 10 can be prevented from being bent or distorted.

A Manufacturing Method of a Ceramic Elements Module

Hereinafter, a manufacturing method of a ceramic elements module according to an embodiment of the present invention will be described in detail with reference to FIGS. 2 to 9.

FIGS. 2 to 9 are process cross-sectional views explaining, in sequence, a manufacturing method of a ceramic elements module according to an embodiment of the present invention.

Figure 2:
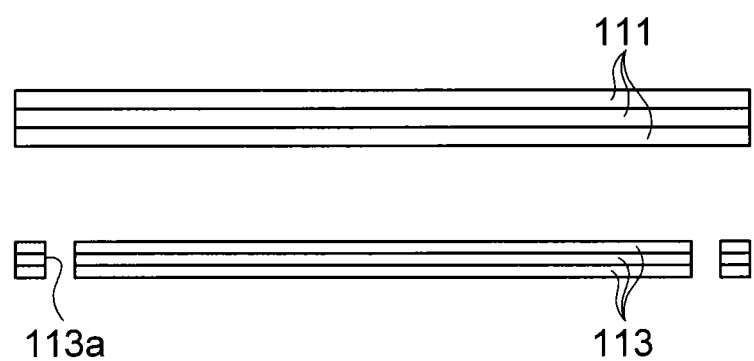
FIGS. 2 to 9 are process cross-sectional views explaining, in sequence, a manufacturing method of a ceramic elements module according to an embodiment of the present invention.
Figure 3:
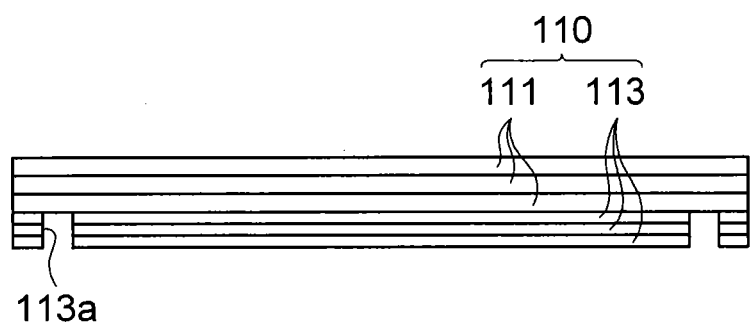

Referring to FIGS. 2 and 3, ceramic elements 110 including a plurality of lower inserting grooves 113a may be first provided in order to manufacture a ceramic elements module 100.

Describing the manufacturing method of the ceramic elements 110, first a plurality of green sheet parts 111 and 113 mixed with ceramic and organic material are provided.

At this time, the material of the green sheet parts 111 and 113 are not specifically limited if it is ceramic material, but, for example, low temperature sintered ceramic material is preferable. The low temperature sintered ceramic material is ceramic material that can be sintered at a temperature of 1050° C. or less and can be fired simultaneously with silver or cooper having low resistivity. The green sheet parts 111 and 113 may have a thickness of about 0.1 mm or less but it is not always limited thereto.

Next, the green sheet parts 111 and 113 are processed in a desired size and shape. At this time, the green sheet parts 111 and 113 may be separated into an upper green sheet part 111 and a lower green sheet part 113 having a plurality of cavities 113a. At this time, the lower inserting grooves 113a are formed as the cavities 113a are stacked, such that the cavities use the same reference numeral as the lower inserting grooves 113a. The cavities 113a are formed using a punching method, wherein they may be formed in a circular shape or a rectangular shape.

Next, a pattern having a wiring circuit or a passive device formed on the surfaces of the upper and lower green sheet parts 111 and 113 or inside thereof is formed. At this time, the wiring circuit may be formed on the surfaces of the upper green sheet parts 111 and 113, inside thereof, or penetrating therethrough, wherein the green sheet parts 111 and 113 are electrically connected through the wiring circuit.

Next, the upper and lower green sheet parts 111 and 113 are aligned and stacked to be compressed at a pressure of about 10 MPa to 50 MPa at a temperature from 60 to 80° C. However, such temperature and compressive pressure are illustrative, but they are not always limited thereto.

The upper and lower green sheet parts 111 and 113 compressed to be integrated as described above are fired, thereby completing the ceramic elements 110 having the lower inserting grooves 113a.

At this time, the firing temperature is preferably a temperature that low temperature sintered ceramic material is sintered, for example, a temperature range from 800 to 1050° C. When the firing temperature is below 800° C., the ceramic component of the upper and lower green sheet parts 111 and 113 may not be sufficiently sintered, and when the firing temperature is above 1050° C., metal particles of the pattern including the wiring circuit or the passive device are melt at the time of firing so that it may be diffused into the upper and lower green sheet parts 111 and 113.

Figure 4:
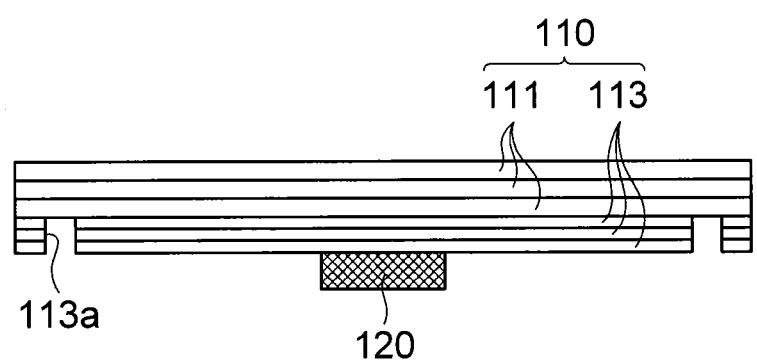

Referring to FIG. 4, an electronic component 120 is mounted on a lower surface of the ceramic elements 110 completed as described above. At this time, the electronic component 120, which is an angle sensor, may be soldered on the ceramic elements 110 by a surface mounting technology (SMT).

Figure 5:
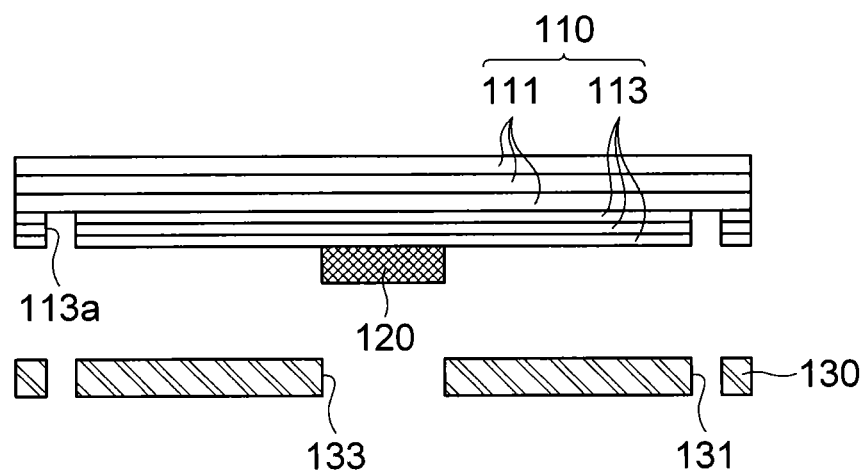

Referring to FIG. 5, a heat sink 130 is provided on a lower part of the ceramic elements 110. The heat sink 130 has a first penetrating hole 131 on a position corresponding to the lower inserting groove 113a and a second penetrating hole 133 on a position corresponding to the electronic component 120. At this time, the first penetrating hole and the second penetrating hole 131 and 133 may also be formed through an extrusion process.

Figure 6:
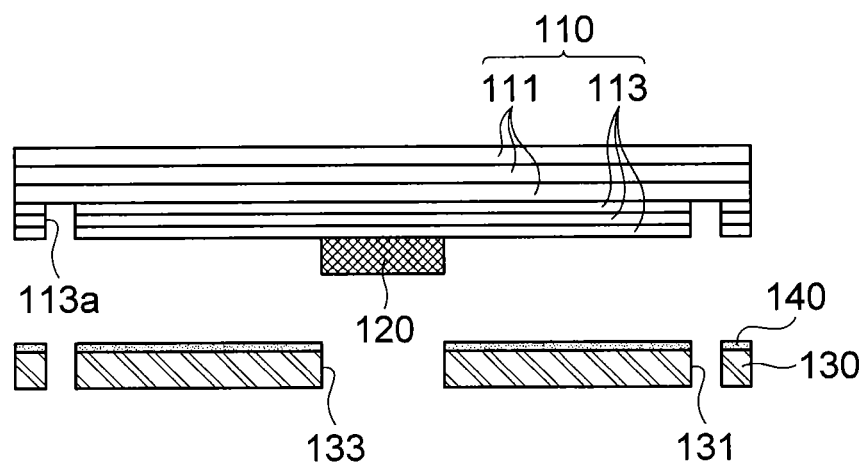
Figure 7:
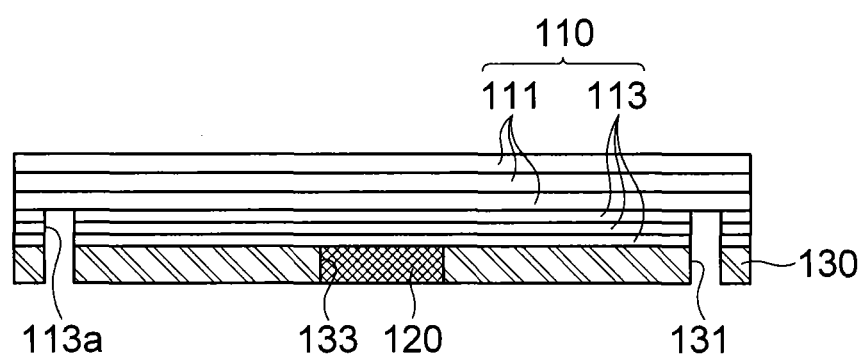

Referring to FIGS. 6 and 7, after an adhering member 140 is coated on a junction interface between the heat sink 130 provided as described above and the ceramic elements 110 mounted with the electronic component 120, the ceramic elements 110 and the heat sink 130 are coupled to each other.

Figure 8:
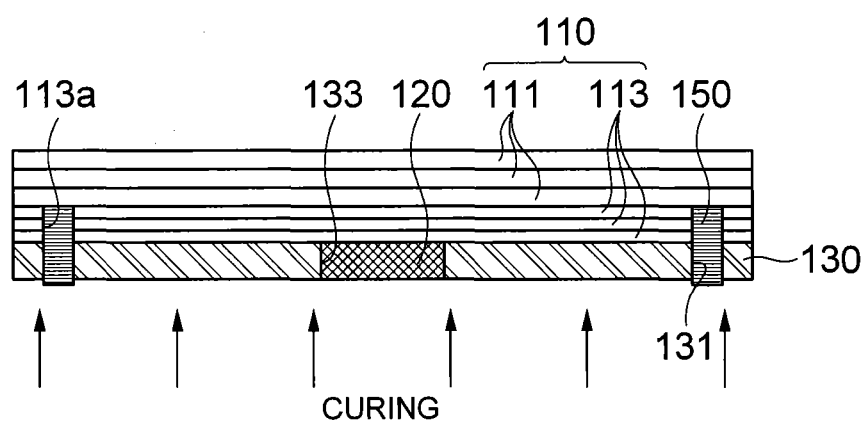
Figure 9:
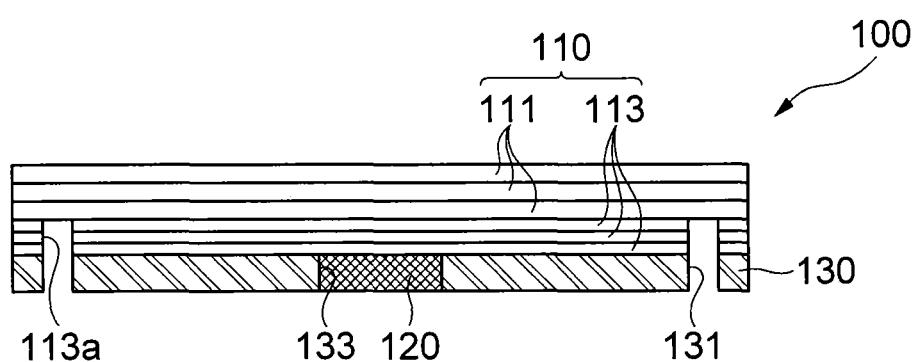

Referring to FIGS. 8 and 9, a fixing member 150 is engaged with the lower inserting groove 113a of the ceramic elements 110 and the first penetrating hole 131 of the heat sink 130 that are coupled to each other through the adhering member 140. Next, after the adhering member 140 coated on the junction interface between the ceramic elements 110 and the heat sink 130 is cured in a high temperature atmosphere, if the ceramic elements 110 and the heat sink 130 are firmly coupled to each other, the fixing member 150 is removed.

As described above, the fixing member 150 that fixes the ceramic elements 110 to the heat sink 130 is provided, such that coupled precision between the ceramic elements 110 and the heat sink 130 is improved and errors in concentricity of the electronic component 120 are minimized, making it possible to enhance reliability and marketability of the product. Further, even after being cured, the ceramic elements 110 can be prevented from being bent or distorted.

As described above, the ceramic elements module and the manufacturing method thereof according to the present invention includes ceramic elements that have lower inserting grooves, a heat sink that has a first penetrating hole, and a fixing member that is engaged with the lower inserting grooves through the first penetrating hole to fix the ceramic elements to the heat sink, to improve the coupled precision between the ceramic elements and the heat sink, thereby making it possible to enhance efficiency of coupling work.

Further, the present invention includes the fixing member that fixes the ceramic elements to the heat sink, making it possible to prevent the ceramic elements from being bent or distorted even after the curing process that is performed after the ceramic elements and the heat sink are coupled.

Moreover, with the present invention, the ceramic elements and the heat sink are always aligned and fixed on predetermined positions to minimize errors in concentricity of the electronic component mounted on the lower surface of the LTTC, making it possible to enhance reliability and marketability of the product.

Therefore, the present invention lowers the defect rate generated when coupling the ceramic elements to the heat sink, having effects to enhance production and to reduce manufacturing costs.

Although the preferred embodiment of the present invention is described, it will be apparent to those skilled in the art that various modifications and variations can be made in the present invention without departing from the spirit or scope of the inventions.

Therefore, it is intended that the present invention covers the modifications and variations of this invention provided they come within the scope of the appended claims and their equivalents.

What is claimed is:

1. A ceramic elements module, comprising:
ceramic elements that have a plurality of lower inserting grooves disposed on a lower surface of the ceramic elements;
an electronic component that is mounted on the lower surface of the ceramic elements; and
a heat sink that is coupled with a lower part of the ceramic elements mounted with the electronic component, and has a plurality of first penetrating holes corresponding to the plurality of lower inserting grooves and a second penetrating hole into which the electronic component is inserted,
wherein a lower surface of the electronic component is coplanar with a lower surface of the heat sink.

2. The ceramic elements module according to claim 1, wherein the electronic component is an angle sensor.

3. The ceramic elements module according to claim 1, wherein the plurality of lower inserting grooves and the plurality of first penetrating holes are formed in a circular shape or a rectangular shape.

4. The ceramic elements module according to claim 1, further comprising: a fixing member that is engaged with a lower inserting groove of the plurality of lower inserting grooves through a first penetrating hole of the plurality of first penetrating holes to fix the ceramic elements to the heat sink.

5. The ceramic elements module according to claim 1, wherein an adhering member is provided on a junction surface between the ceramic elements and the heat sink.

6. The ceramic elements module according to claim 1, wherein the plurality of lower inserting grooves and the plurality of first penetrating holes are empty.

* * * * *